(12) United States Patent
Chidambarrao et al.

(10) Patent No.: US 7,345,329 B2
(45) Date of Patent: Mar. 18, 2008

(54) METHOD FOR REDUCED N+ DIFFUSION IN STRAINED SI ON SIGE SUBSTRATE

(75) Inventors: Dureseti Chidambarrao, Weston, CT (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/057,129

(22) Filed: Feb. 15, 2005

(65) Prior Publication Data

US 2005/0145992 A1 Jul. 7, 2005

Related U.S. Application Data

(62) Division of application No. 10/605,108, filed on Sep. 9, 2003.

(51) Int. Cl.
*H01L 31/112* (2006.01)
(52) U.S. Cl. ............... 257/279; 257/274; 257/E27.062; 257/E27.108
(58) Field of Classification Search ................ 257/274, 257/279
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |

(Continued)

FOREIGN PATENT DOCUMENTS

JP 64-76755 3/1989

OTHER PUBLICATIONS

Kern Rim, et al., "Transconductance Enhancement in Deep Submicron Strained-Si *n*-MOSFETs", International Electron Devices Meeting, 26, 8, 1, IEEE, Sep. 1998.
Kern Rim, et al., "Characteristics and Device Design of Sub-100 nm Strained Si N– and PMOSFETs", 2002 Symposium On VLSI Technology Digest of Technical Papers, IEEE, pp. 98-99.

(Continued)

*Primary Examiner*—Long Pham
(74) *Attorney, Agent, or Firm*—Joseph P. Abate; Greenblum & Bernstein, P.L.C.

(57) ABSTRACT

The first source and drain regions are formed in an upper surface of a SiGe substrate. The first source and drain regions containing an N type impurity. Vacancy concentration in the first source and drain regions are reduced in order to reduce diffusion of the N type impurity contained in the first source and drain regions. The vacancy concentration is reduced by an interstitial element or a vacancy-trapping element in the first source and drain regions. The interstitial element or the vacancy-trapping element is provided by ion-implantation.

17 Claims, 3 Drawing Sheets

U.S. PATENT DOCUMENTS

| | | |
|---|---|---|
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,972,783 A | 10/1999 | Arai et al. |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,372,590 B1* | 4/2002 | Nayak et al. ............... 438/305 |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,689,671 B1 | 2/2004 | Yu et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0047125 A1 | 4/2002 | Fukuda et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0227061 A1 | 12/2003 | Yokoagawa et al. |
| 2004/0140481 A1* | 7/2004 | Jagannathan et al. ....... 257/197 |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

Gregory Scott, et al., "NMOS Drive Current Reduction Caused by Transistor Layout and Trench Islation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors," IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors fo Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx S1 1-x/Si Strained-Layer Superlattice Grown by Molecular Bean Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojuction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for S1 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

US 7,345,329 B2

METHOD FOR REDUCED N+ DIFFUSION IN STRAINED SI ON SIGE SUBSTRATE

CROSS REFERENCE TO RELATED APPLICATION

This application is a divisional application of U.S. application Ser. No. 10/605,108, filed on Sep. 9, 2003, which is now incorporated herein by reference in its entirety.

BACKGROUND OF INVENTION

The invention relates to methods for manufacturing a semiconductor device with improved device performance and a device structure exhibiting the improved device performance, and more particularly to a method for manufacturing a SiGe-based device exhibiting reduced diffusion of an N type impurity.

The escalating requirements for ultra large scale integration semiconductor devices require ever increasing high performance and density of transistors. With scaling-down of a device dimension reaching limits, the trend has been to seek new materials and methods that enhance device performance. One of the most preferred methods is through mobility enhancement.

It is known that biaxial tensile strain applied to a channel region increases electron mobility in NFET devices. This can be achieved by building an NFET device, which is composed of a set of stacked films (e.g., silicon-SiGe-silicon) on a substrate. Starting from a silicon substrate, SiGe is grown on the silicon substrate. Buffered layers have typically been used to reduce threading dislocation defect density that can affect device leakage but still achieve enough relaxation through misfit dislocation formation. The SiGe film is relaxed so that it has a lattice constant larger than that of silicon. When the silicon is then deposited on the SiGe, it conforms to the larger lattice of the relaxed SiGe and undergoes biaxial tension. The channel is fully contained within this strained silicon and the electron mobility is enhanced.

The SiGe-based substrate, however, exhibits certain drawbacks, especially when NFET devices are formed thereon. To form an NFET device, an N type impurity (e.g., As or P) is ion-implanted onto the SiGe-based substrate to form active regions (e.g., source and drain regions). Here, the excessive amount of vacancies contained in the SiGe layer undesirably increases diffusion of the implanted N type impurity. This makes it more difficult to achieve consistent roll-off device characteristics. Therefore, there is a need for effective methodology for manufacturing a SiGe-based semiconductor device.

SUMMARY OF INVENTION

In an aspect of the invention, a method for manufacturing a semiconductor device is provided. The method includes the step of forming the source and drain extension regions in an upper surface of a SiGe-based substrate. The source and drain extension regions contain an N type impurity. Then, vacancy concentration in the source and drain extension regions is reduced in order to reduce diffusion of the N type impurity contained in the source and drain extension regions. The vacancy concentration is reduced by providing an interstitial element or a vacancy-trapping element in the source and drain extension.

In another aspect of the invention, a method is provided for reducing diffusion of an N type impurity in a SiGe-based substrate. Source and drain extension regions are in an upper surface of the SiGe-based substrate. An interstitial element or a vacancy-trapping element is ion-implanted into the source and drain extension regions to reduce vacancy concentration in the source and drain extension regions.

Yet another aspect of the invention is a semiconductor device having a SiGe-based substrate. A gate electrode is formed on the SiGe-based substrate with a gate oxide therebetween. source and drain extension regions containing an N type impurity are formed in an upper surface of the SiGe substrate. A low vacancy region is formed corresponding to the source and drain extension regions and containing an interstitial element or a vacancy-trapping element.

BRIEF DESCRIPTION OF DRAWINGS

The foregoing and other advantages will be better understood from the following detailed description of a preferred embodiment of the invention with reference to the drawings, in which.

DETAILED DESCRIPTION

The invention provides a method that significantly reduces undesirable diffusion of the N type impurity in a SiGe-based substrate, thereby improving roll-off characteristics of devices. In an embodiment, the diffusion of N type impurity is reduced by reducing vacancies in source and drain extension regions. The vacancies are reduced by providing an interstitial element (e.g., Si or O) or a vacancy-trapping element (e.g., F, N, Xe, Ar, He, Kr or a noble gas element) to the source and drain extension regions.

Typically, the interstitial element creates an additional interstitial per every ion provided thereto, and the additional interstitials react with and annihilate excessive vacancies in the SiGe-based substrate. The vacancy-trapping element trap vacancies and form vacancy-based clusters. Since vacancies are either annihilated or trapped by the interstitial element or the vacancy-trapping element, vacancy concentration is reduced, thereby reducing diffusion of the N type impurity in the source and drain regions.

Figure 1:
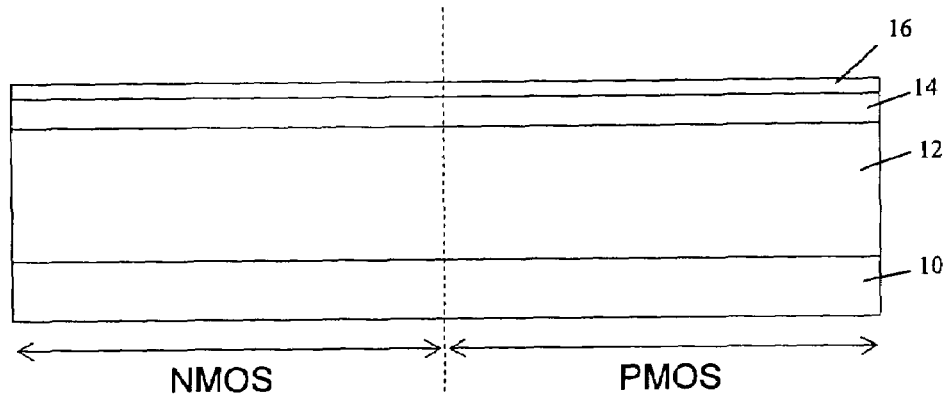
FIGS. 1 to 7 depict sequential phases of the method according to an embodiment of the invention.

FIG. 1 shows a SiGe-base substrate comprising a SiGe layer 12 formed on a silicon substrate 10. In an embodiment, the SiGe layer 12 is formed by multiple growing steps forming buffer layers on the silicon substrate 10 for a typical total thickness of approximately 200 Å to 20000 Å. The SiGe layer 12 is then relaxed. A Si cap layer 14 is formed on the SiGe layer 12 by growing on the SiGe layer 12 at a thickness of approximately 30 Å to 400 Å. The Si cap layer 14 is then strained biaxially in tension to match the underlying relaxed SiGe lattice. A gate oxide layer 16 is formed on the Si cap layer 14. The SiGe-based substrate is divided into an NMOS region and a PMOS region, in which NMOS devices and PMOS devices are formed, respectively.

Figure 2:
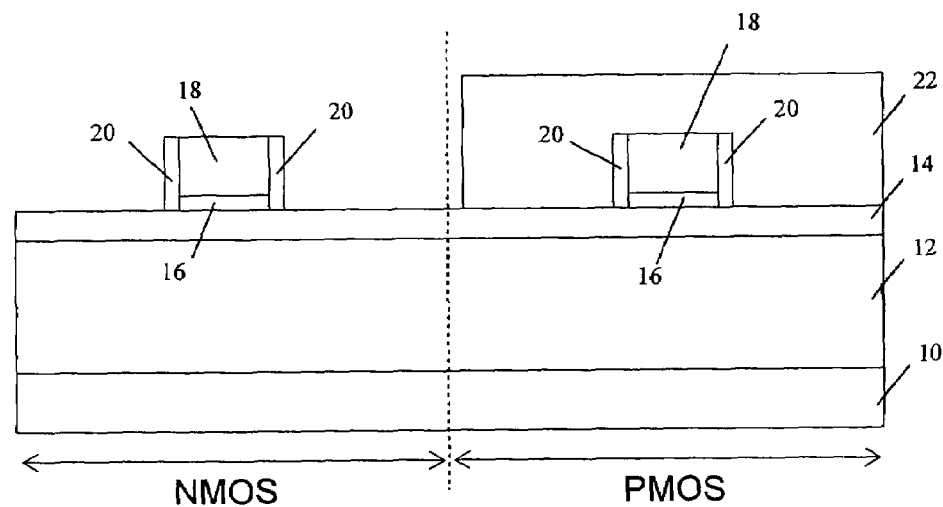

FIG. 2 shows a gate electrode 18 formed on the gate oxide layer 16. Since the invention is directed to N type devices, a mask 22 is formed selectively on the PMOS region to protect the PMOS devices therein from subsequent processing steps. FIG. 2 further shows optional sidewalls 20 formed on the side surfaces of the gate electrode 1 for protecting the gate electrode 18 from subsequent ion-implantation steps.

Figure 3:
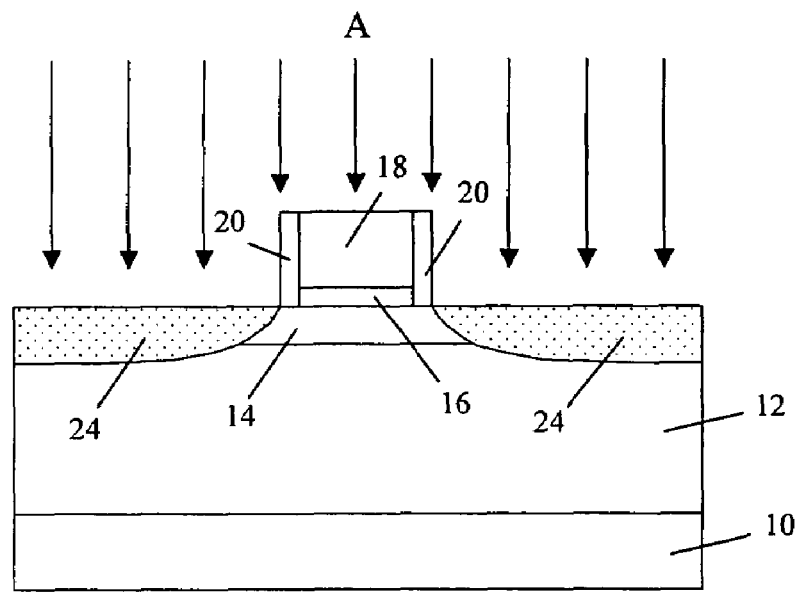

FIG. 3 shows only the NMOS region of FIG. 2, in which the N type impurity (e.g., As or P) is ion-implanted, as shown by arrows "A", into the upper surface of the Si cap layer 14 to form source and drain extension regions 24 in the surface portions of the SiGe-based substrate. As shown therein, the ion-implantation is performed in a self-aligned manner by using the gate electrode 18 as a mask, at an implantation concentration of approximately $1\times10^{14}$ atoms/cm$^2$ to $1\times10^{16}$ atoms/cm$^2$ and at an implantation energy of approximately 0.3 KeV to 50 KeV. The concentration peak of the implanted N type impurity is formed at a depth of approximately 10 Å to 1000 Å from an upper surface of the Si cap layer.

Figure 4:
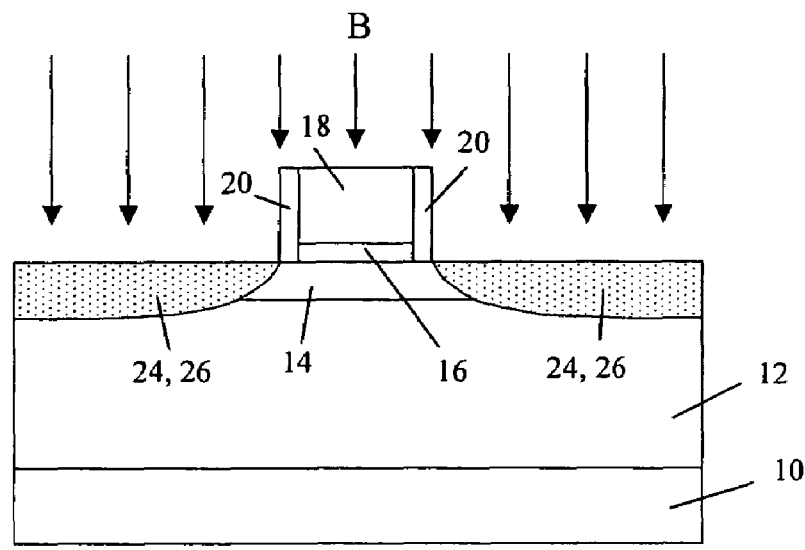

As described above, diffusion of the N type impurity (e.g., As or P) is significantly and undesirably enhanced in the SiGe-based substrate because the vacancy-based mechanism is more pronounced therein. To solve this problem, as shown in FIG. 4, an interstitial element (e.g., Si or O) or a vacancy-trapping element (e.g., F, N, Xe, Ar, He, Kr or other noble gas elements) is ion-implanted onto the source and drain extension regions 24, as shown by arrows "B", to form low-vacancy regions 26 that substantially overlap the source and drain extension regions 24.

Upon implantation, damage is caused in such a way that, upon annealing of the damage, the interstitials annihilate the excessive vacancies, thereby reducing the vacancy concentration in the extension regions 24. Similarly, the implanted vacancy-trapping element traps the excessive vacancies and form vacancy-based clusters, and hence reduces the vacancy concentration in the source and drain extension regions 24. Annealing at this stage is optional.

in an embodiment, the interstitial element or a vacancy-trapping element is ion-implanted at an implantation concentration of approximately $1\times10^{14}$ atoms/cm$^2$ to $1\times10^{16}$ atoms/cm$^2$ and at an implantation energy of approximately 0.3 KeV to 100 KeV. The concentration peak of the implanted interstitial element or the vacancy-trapping element is formed at a depth of approximately 5 Å to 2000 Å from an upper surface of the Si cap layer. Typically the implant profile of the interstitial element or vacancy-trapping element should fully contain the N type impurity profile. The concentration peak of the implanted interstitial element or vacancy-trapping element can be near the N type impurity peak so as to maximize the diffusion retardation.

It is not necessary to form the source and drain extension regions 24 prior to ion-implanting the interstitial element or a vacancy-trapping element. The low-vacancy region 26 may be formed prior to forming the source and drain extension regions 24. Annealing can then be performed to activate the implanted impurity and elements at the same time so that the diffusion through the vacancy-mediated mechanism is controlled. Annealing can also be performed later in the processing steps (e.g., after source and drain formation) or after completion of the fabrication process.

Figure 5:
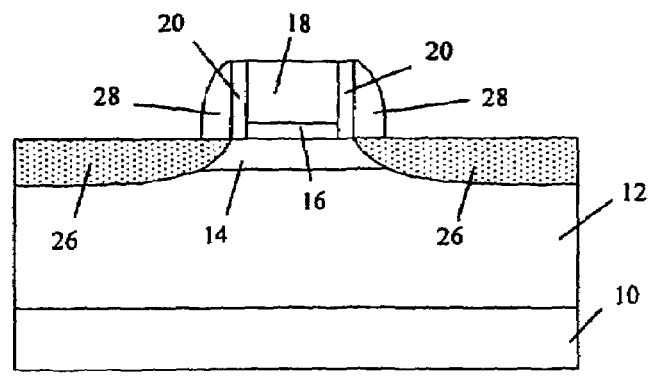
Figure 6:
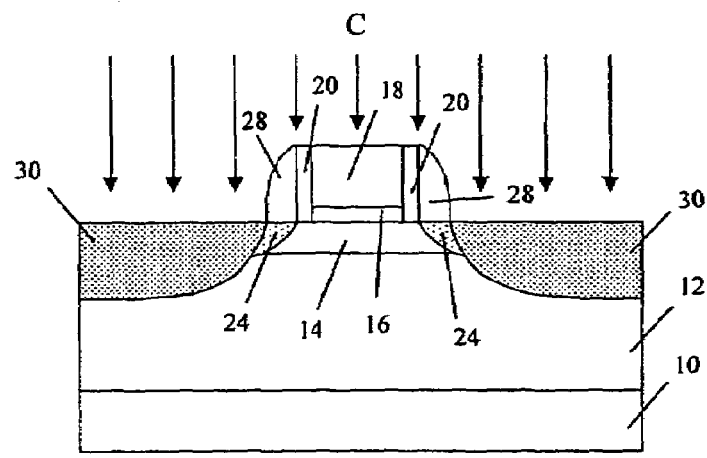

After forming sidewall spacers 28, as shown in FIG. 5, the N type impurity is ion-implanted into the SiGe-based substrate, as shown by arrows "C", to form source and drain regions 30, as shown in FIG. 6. The source and drain regions 30 overlap the source and drain extension regions 24, respectively. The N type impurity is ion-implanted in the self-aligned manner by using the gate electrode 18 and the sidewall spacers 28 as a mask. In an embodiment, the source and drain regions 30 are formed by ion-implanting the N type impurity at an implantation concentration of approximately $1\times10^{14}$ atoms/cm$^2$ to $1\times10^{16}$ atoms/cm$^2$ and at an implantation energy of approximately 0.3 KeV to 50 KeV.

Figure 7:
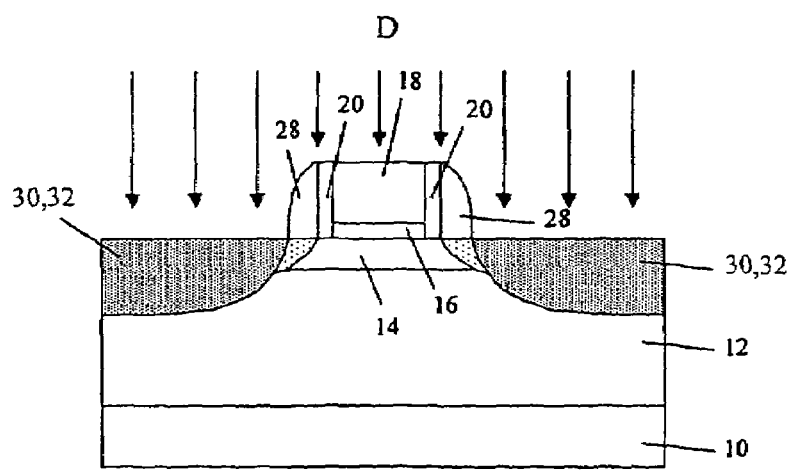

FIG. 7 shows an optional step of ion-implanting the interstitial element or a vacancy-trapping element (e.g., F, N, Xe, Ar, He, Kr or a noble gas element), as shown by arrows "D", to form low-vacancy regions 32 of the SiGe-based substrate corresponding to the source and drain regions 30 for reducing the vacancy concentration in the SiGe-based substrate. In an embodiment, the low-vacancy regions 32 are formed by ion-implanting the interstitial element or vacancy-trapping element at an implantation concentration of approximately $1\times10^{14}$ atoms/cm$^2$ to $1\times10^{16}$ atoms/cm$^2$ and at an implantation energy of approximately 0.3 KeV to 100 KeV. This step, however, might not be necessary If the vacancy concentration in the SiGe-based substrate has been sufficiently reduced by the previous ion-implantation step shown in FIG. 4. Again, the peaks of the N type implants and interstitial elements or vacancy-trapping element in regions 30 and 32 can be aligned on the top of each other or shifted depending upon the diffusion control.

Annealing is performed to activate the implanted impurity and cure the implantation damage arising from implanting the interstitial element or a vacancy-trapping element and source and drain implants. In an embodiment, the annealing is performed at a temperature of approximately 700° C. to 1200° C. for approximately 1 second to 3 minutes. This covers the full range of possible anneals including spike, rapid thermal, and furnace anneals.

As explained above, the invention provides a method that significantly reduces undesirable diffusion of the N type impurity in a SiGe-based substrate. The diffusion of N type impurity is reduced by reducing vacancies in source and drain extension regions. The vacancies are reduced by providing an interstitial element or a vacancy-trapping element to the source and drain extension regions. The implanted interstitial element creates additional Interstitials which react with and annihilate excessive vacancies in the SiGe-based substrate. The implanted vacancy-trapping element traps vacancies and forms vacancy-based clusters. Since vacancies are either annihilated or trapped by the interstitial element or the vacancy-trapping element, vacancy concentration is reduced and diffusion of the N type Impurity is reduced in the source and drain regions, thereby improving roll-off characteristics of devices.

While the invention has been described in terms of embodiments, those skilled in the art will recognize that the invention can be practiced with modification within the spirit and scope of the appended claims.

The invention claimed is:

1. A semiconductor device comprising:
   a relaxed SiGe-based substrate;
   a tensile biaxially strained Si cap layer formed on the relaxed SiGe-based substrate;
   a gate electrode formed on the relaxed SiGe-based substrate with a gate oxide formed on the Si cap layer;
   source and drain extension regions formed in an upper surface of the SiGe substrate and containing an N type impurity; and
   a low vacancy region that overlap the source and drain extension regions and containing an interstitial element or a vacancy-trapping element,
   wherein an implant profile of the interstitial element or the vacancy-trapping element fully contains an N type impurity profile, whereby diffusion retardation is maximized.

2. The semiconductor device of claim 1, wherein the interstitial element is Si or O and the vacancy-trapping element is F, N, Xe, Ar, He, Kr or a noble gas element.

3. The semiconductor device of claim 1, wherein each of the interstitial element or the vacancy-trapping element is ion-implanted.

4. The semiconductor device of claim 1, wherein the semiconductor device is an N type device.

5. The semiconductor device of claim 1, wherein the N type impurity is ion-implanted in a self-aligned manner.

6. The semiconductor device of claim 1, wherein the vacancy-trapping element forms vacancy-based clusters.

7. A semiconductor device comprising:
a relaxed SiGe-based substrate;
a tensile biaxially strained Si cap layer formed on the relaxed SiGe-based substrate and which matches a lattice of the relaxed SiGe-based substrate;
a gate electrode formed on the SiGe-based substrate with a gate oxide therebetween;
source and drain extension regions formed in a surface of the relaxed SiGe substrate and containing an N type impurity; and
low vacancy regions, containing an interstitial element or a vacancy-trapping element, formed in the source and drain extension regions,
wherein an implant profile of the interstitial element or the vacancy-trapping element fully contains an N type impurity profile, whereby diffusion retardation is maximized.

8. The semiconductor device of claim 7, wherein the interstitial element is Si or O and the vacancy-trapping element is F, N, Xe, Ar, He, Kr or a noble gas element.

9. The semiconductor device of claim 7, wherein each of the interstitial element or the vacancy-trapping element is ion-implanted.

10. The semiconductor device of claim 7, wherein the semiconductor device is an N type device.

11. The semiconductor device of claim 7, wherein the N type impurity is ion-implanted in a self-aligned manner.

12. The semiconductor device of claim 7, wherein the vacancy-trapping element forms vacancy-based clusters.

13. A semiconductor device comprising:
a relaxed SiGe-based substrate;
a gate electrode formed on the SiGe-based substrate with a gate oxide therebetween;
source and drain extension regions formed in an upper surface of the SiGe substrate and containing an N type impurity; and
low vacancy regions, containing an interstitial element or a vacancy-trapping element, that substantially overlap the source and drain extension regions,
wherein an implant profile of the interstitial element or the vacancy-trapping element fully contains an N type impurity profile, whereby diffusion retardation is maximized.

14. The semiconductor device of claim 13, wherein the interstitial element is Si or O and the vacancy-trapping element is F, N, Xe, Ar, He, Kr or a noble gas element.

15. The semiconductor device of claim 13, wherein each of the interstitial element or the vacancy-trapping element is ion-implanted.

16. The semiconductor device of claim 13, wherein the semiconductor device is an N type device.

17. The semiconductor device of claim 13, wherein the N type impurity is ion-implanted in a self-aligned manner and the vacancy-trapping element forms vacancy-based clusters.

* * * * *